United States Patent
Huang et al.

(10) Patent No.: US 7,675,448 B1
(45) Date of Patent: Mar. 9, 2010

(54) CONTINUOUS-TIME SIGMA-DELTA MODULATOR USING DYNAMIC ELEMENT MATCHING HAVING LOW LATENCY AND DYNAMIC ELEMENT MATCHING METHOD THEREOF

(75) Inventors: Sheng-Jui Huang, Hsinchu (TW); Yung-Yu Lin, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/202,339

(22) Filed: Sep. 1, 2008

(51) Int. Cl.
*H03M 3/00* (2006.01)

(52) U.S. Cl. .................... 341/143; 341/144

(58) Field of Classification Search ............ 341/143
See application file for complete search history.

(56) References Cited

U.S. PATENT DOCUMENTS 6,426,714 B1 * 7/2002 Ruha et al. ............ 341/143
7,576,671 B2 * 8/2009 Petilli et al. ............ 341/143

OTHER PUBLICATIONS

Mitteregger et. al, IEEE Journal of Solid-State Circuits, vol. 41, No. 12, Dec. 2006, Dec. 1, 2006.
Dorrer, L., IEEE Solid-State Circuits Conference, 2003. ESSCIRC '03. Proceedings of the 29th European, P245-248, Sep. 16, 2003.
* cited by examiner

*Primary Examiner*—Lam T Mai
(74) *Attorney, Agent, or Firm*—Winston Hsu

(57) ABSTRACT

In a continuous-time sigma-delta modulator, by using dynamic element matching (DEM) with respect to comparators of a quantizer, or by generating a plurality of candidate DEM results in advance for selecting an approximate DEM result, a time slot for DEM operations in each cycle of a sampling signal is significantly increased without being rushed.

19 Claims, 14 Drawing Sheets

| DAC unit | 1 | 2 | 3 | 4 | 5 | 6 | 7 |
|---|---|---|---|---|---|---|---|
| code(1)=3 | ▨ | ▨ | ▨ | | | | |
| code(2)=1 | ▨ | | | | | | |
| code(3)=5 | ▨ | ▨ | ▨ | ▨ | ▨ | | |
| code(4)=3 | ▨ | ▨ | | ▨ | | | |
| code(5)=2 | ▨ | | | ▨ | ▨ | ▨ | |
| code(6)=4 | ▨ | | | ▨ | | | |

FIG. 5 PRIOR ART

CONTINUOUS-TIME SIGMA-DELTA MODULATOR USING DYNAMIC ELEMENT MATCHING HAVING LOW LATENCY AND DYNAMIC ELEMENT MATCHING METHOD THEREOF

BACKGROUND OF THE INVENTION

1. Field of the Invention

The present invention relates to sigma-delta modulators and dynamic element matching methods thereof, and more particularly, to continuous-time sigma-delta modulators using dynamic element matching (DEM) having low latency and dynamic element matching methods thereof.

2. Description of the Prior Art

Please refer to FIG. 1, which is a diagram of a conventional continuous-time sigma-delta modulator 100 using dynamic element matching (DEM). As shown in FIG. 1, the continuous-time sigma-delta modulator 100 includes a frequency response module 102, a quantizer 104, a DEM module 106, a digital-to-analog (DAC) converter 108, an adder 110, and a digital low-pass filter (LPF) 112. A first continuous-time signal x(t) is received at a first input terminal of the adder 110 as a resource signal, whereas a second continuous-time signal y(t) is inputted at a second input terminal of the adder 110 for compensating possible errors in the first continuous-time signal x(t). A continuous-time signal q(t) generated by the frequency response module 102 is sampled by the quantizer 104 according to a clock signal ck inputted to the quantizer 104 as well. The DEM module 106 is responsible for moving mismatches in a digital output signal of the quantizer 104 to high frequencies so that in a next term of the loop shown in FIG. 1, the mismatches are filtered off by the digital low-pass filter 112 along with related noises. Note that an input signal and an output signal of the DEM module 106 are both digital so that the DAC converter 108 is responsible for transforming the digital output signal of the DEM module 106 into an analog feedback signal, i.e., the second continuous-time signal y(t). Note that the digital low-pass filter 112 helps in noise shaping and down sampling of the output signals of the quantizer 104.

Please refer to FIG. 2, which is a waveform diagram for illustrating an excess loop delay of the analog feedback signal y(t) from the DAC converter 108 shown in FIG. 1. Within a single term of the clock signal ck, a limited time slot has to be reserved for both the quantizer 104 and the DEM module 106 so that an excess loop delay appears in the analog feedback signal y(t).

Please refer to FIG. 3, which is a waveform diagram of the DAC converter 108 shown in FIG. 1 while the DAC converter 108 is implemented with a non-return-to-zero (NRZ) DAC converter. Note that output signal of the DAC converter 108 cannot be zero, as shown in FIG. 3, and have to be applied throughout a whole cycle of the clock signal ck. Therefore, if a time slot has to be reserved for the DEM module 106, the same excess loop delay must appear. Moreover, within a same cycle of the clock signal ck, the output signal of the DAC converter 108 has to be outputted to the adder 110 in a feedback manner as soon as the digital output signal of the quantizer 104 is generated so that the time slot reserved for the DEM module 106 is not available. Otherwise, the excess loop delay shown in FIG. 3 will significantly increase a loop order and incur instability of the continuous-time sigma-delta modulator 100. It indicates a fact that implementing the DAC converter 108 with an NRZ DAC converter must face a tradeoff between loop stability of the continuous-time sigma-delta modulator 100 and an available latency reserved for the DEM module 106.

Please refer to FIG. 4, which is a waveform diagram of the DAC converter 108 shown in FIG. 1 while the DAC converter 108 is implemented with a return-to-zero (RZ) DAC converter. As shown in FIG. 4, and compared to as shown in FIG. 3, since the output signal of the DAC converter 108 may be zero at some times, a required duration of the DAC converter 108 may be cut off before a single cycle of the clock signal ck ends so that an available latency may be reserved for the DEM module 106. Since a conventional sigma-delta modulator uses over-sampling, a related sampling frequency must be high so that a length of the cycle of the clock signal ck must be short, and therefore, the available latency of the DEM module 106 must be as shorter as it can be.

The DEM module 106 is used for balancing a used probability of DAC units of the DAC converter 108. Please refer to FIG. 5, which is a schematic diagram for illustrating how the DEM module 106 works on balances between the DAC units of the DAC converter 108. Nate that codes including code(1), code(2), . . . , and code(6) are assumed to be inputted into the DAC converter 108 in turn. A number of filled fields in each row stands for a number of bits filled at a time t so that the term code(t)=n indicates that n bits should be disposed into the row of the time t. As can be observed from FIG. 5, in each column corresponding to a specific DAC unit, each DAC unit is merely used 2 or 3 times during the codes are inputted into the DAC converter 108 since the bits in the codes are filled in the DAC units in a shuffled and uniform manner. As a result, long-term probabilities of the DAC units being used are close to equal with each other. If the DEM module 106 is not applied on the DAC converter 108, mismatches between the DAC units will limit a linearity of the continuous-time sigma-delta modulator 100, and it indicates the reason why the DEM module 106 should be applied for cooperating with the DAC converter 108.

Please refer to FIG. 6, which is a schematic diagram for illustrating how DEM techniques shown in FIG. 5 work in the continuous-time sigma-delta modulator 100 shown in FIG. 1. Note that in the tables listed in FIG. 6, each column of the bits stands for a specific code having a value between 0 and 3, whereas each column stands for a specific bit in one comparator of the quantizer 104. Please refer to the codes, which have not been processed by the DEM module 106 and are listed in the left table, bits in the codes are all filled in an order of comparators A, B, and C so that a DAC unit in the DAC converter 108 corresponding to the comparator A must be most frequently used than other DAC units. The DEM module 106 arranges the bits in the codes as follows: (1) For the term Code(1)=0, no bits have to be placed; (2) For the term Code(2)=2, two bits are placed corresponding to A' and B' in turn; (3) For the term Code(3)=1, one bit is placed corresponding to C' next to B' since the ending bit in the last code Code(2) is placed corresponding to B'; (4) For the term Code(4)=3, three bits are placed corresponding to A' (Note that A' is cyclically next to C'), B', and C' in turn since the ending bit in the last code Code(3) is placed corresponding to C'; and (5) For the term Code(5)=2, two bits are placed corresponding to A' (Note that A' is cyclically next to C') and B' in turn since the ending bit in the last code Code(4) is placed corresponding to B'. As can be observed from the right table shown in FIG. 6, after arranging the bits in the codes by the DEM module 106, the used probabilities corresponding to A', B', and C' are balanced with respect to those in the left table shown in FIG. 6.

However, the output signals from the DEM module 106 are inputted to the DAC converter 108 at a same cycle of the clock signal ck with raw data (i.e., the codes in the left table shown in FIG. 6) generated from the comparators A, B, C of the quantizer 104. Therefore, the excess loop delay may be generated so that errors occur in the DAC converter 108.

SUMMARY OF THE INVENTION

The claimed invention discloses a continuous-time sigma-delta modulator using dynamic element matching (DEM). The continuous-time sigma-delta modulator comprises a frequency response module, a quantizer, a digital multiplexer, a DEM module, a digital-to-analog (DAC) converter, and an adder. The quantizer has an input terminal coupled to an output terminal of the frequency response module. The digital multiplexer has a first input terminal coupled to an output terminal of the quantizer. The DEM module has an input terminal coupled to the output terminal of the quantizer, and has an output terminal coupled to a second input terminal of the digital multiplexer. The DAC converter having an input terminal coupled to an output terminal of the digital multiplexer. The adder has a first input terminal for receiving a continuous-time signal, has a second input terminal coupled to an output terminal of the DAC converter, and has an output terminal coupled to an input terminal of the frequency response module. Output signals of the quantizer during a current cycle are sent to the DEM module to determine a selection result of the digital multiplexer at a next cycle.

The claimed invention further discloses a continuous-time sigma-delta modulator using dynamic element matching (DEM). The continuous-time sigma-delta modulator comprises a frequency response module, a quantizer, a DEM group, a digital multiplexer, a digital comparator, a digital-to-analog (DAC) converter, and an adder. The quantizer has an input terminal coupled to an output terminal of the frequency response module. The DEM group has a plurality of DEM modules, and has an input terminal coupled to the output terminal of the quantizer. The digital multiplexer has a first input terminal coupled to an output terminal of the DEM group. The digital comparator has an input terminal coupled to the quantizer, and has an output terminal coupled to the digital multiplexer. The digital-to-analog (DAC) converter has an input terminal coupled to an output terminal of the digital multiplexer. The adder has a first input terminal for receiving a continuous-time signal, has a second input terminal coupled to an output terminal of the DAC converter, and has an output terminal coupled to an input terminal of the frequency response module. Each of the plurality of DEM modules in the DEM group generates a candidate selection result of the digital multiplexer in advance. Output signals of the quantizer during a current cycle are sent to both the DEM group and the digital comparator to compare incoming codes from the quantizer with predicted codes from the DEM group for determining a selected result from a plurality of candidate selection results from the DEM group by the digital multiplexer at a next cycle.

The claimed invention discloses a dynamic element matching method for a continuous-time sigma-delta modulator. The dynamic element matching method comprises shuffling a plurality of output bits from a plurality of comparators of a quantizer by cyclically shifting available bits in a selection set according to balances in using DAC units of a DAC converter; and outputting the shuffled plurality of output bits to the DAC converter.

The claimed invention further discloses a dynamic element matching method for a continuous-time sigma-delta modulator. The dynamic element matching method comprises a plurality of comparators of a quantizer transforming a frequency response signal from a frequency response module into a plurality of bits, each of which is outputted from a corresponding comparator of the plurality of comparators; shuffling the plurality of bits outputted from the plurality of comparators by cyclically shifting different numbers of available bits in a selection set according to balances in using DAC units of a DAC converter; and a digital comparator determining a shuffled plurality of bits by comparing predicted codes with incoming codes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a schematic diagram for illustrating how the DEM module works on balances between the DAC units of the DAC converter shown in FIG. 1.

DETAILED DESCRIPTION

Figure 1:
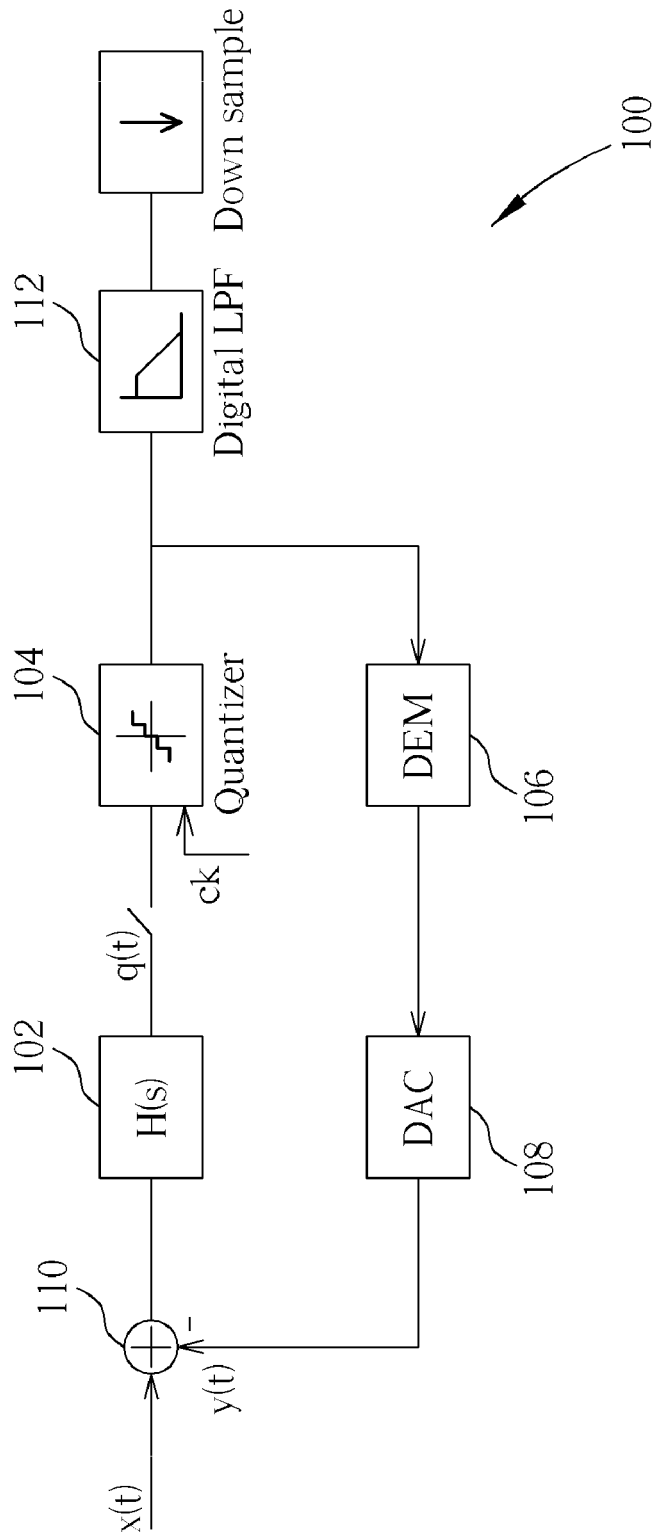
FIG. 1 is a diagram of a conventional continuous-time sigma-delta modulator using dynamic element matching.

For resolving the defects described in the prior art, the present invention discloses some continuous-time sigma-delta modulators. In the disclosed continuous-time sigma-delta modulators, the DEM module 106 is moved out of the loop, which includes the frequency response module 102, the quantizer 104, the DEM module 106, the DAC converter 108, and the adder 110 so that the output signals from the DEM module 106 are not required to be inputted to the DAC converter 108 at the same cycle of the clock signal ck with the raw data generated from the comparators of the quantizer 104. Moreover, the output signals from the DEM module 106 are processed by the DAC converter 108 at a next-adjacent cycle after said output signals are generated from the DEM module 106, i.e., the output signals from the DEM module 106 are delayed by one cycle for being processed by the DAC converter 108 so that the latency for the DEM module 106 is not as critical in each cycle of the clock signal ck as in the prior art.

Figure 2:
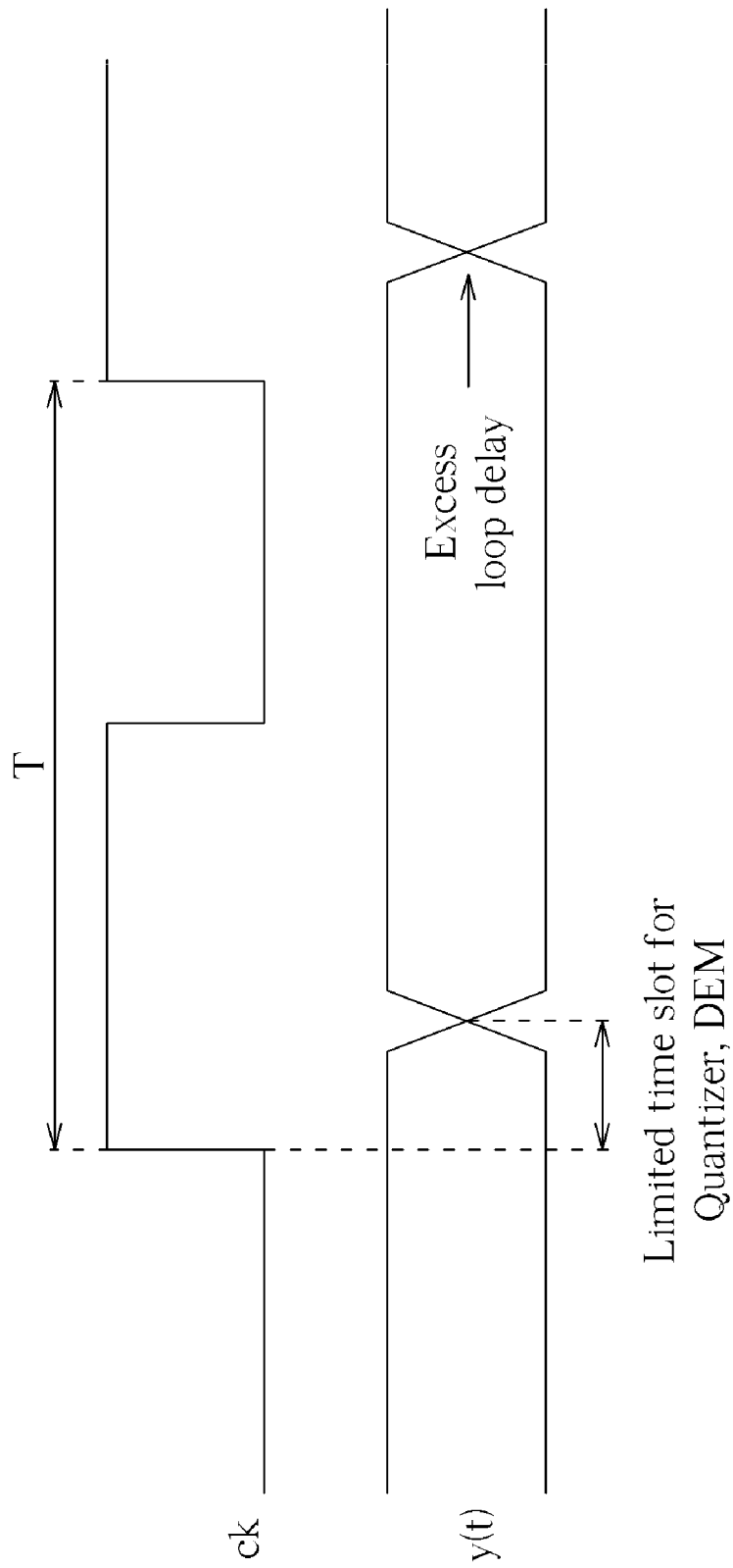
FIG. 2 is a waveform diagram for illustrating an excess loop delay of the analog feedback signal from the DAC converter shown in FIG. 1.
Figure 3:
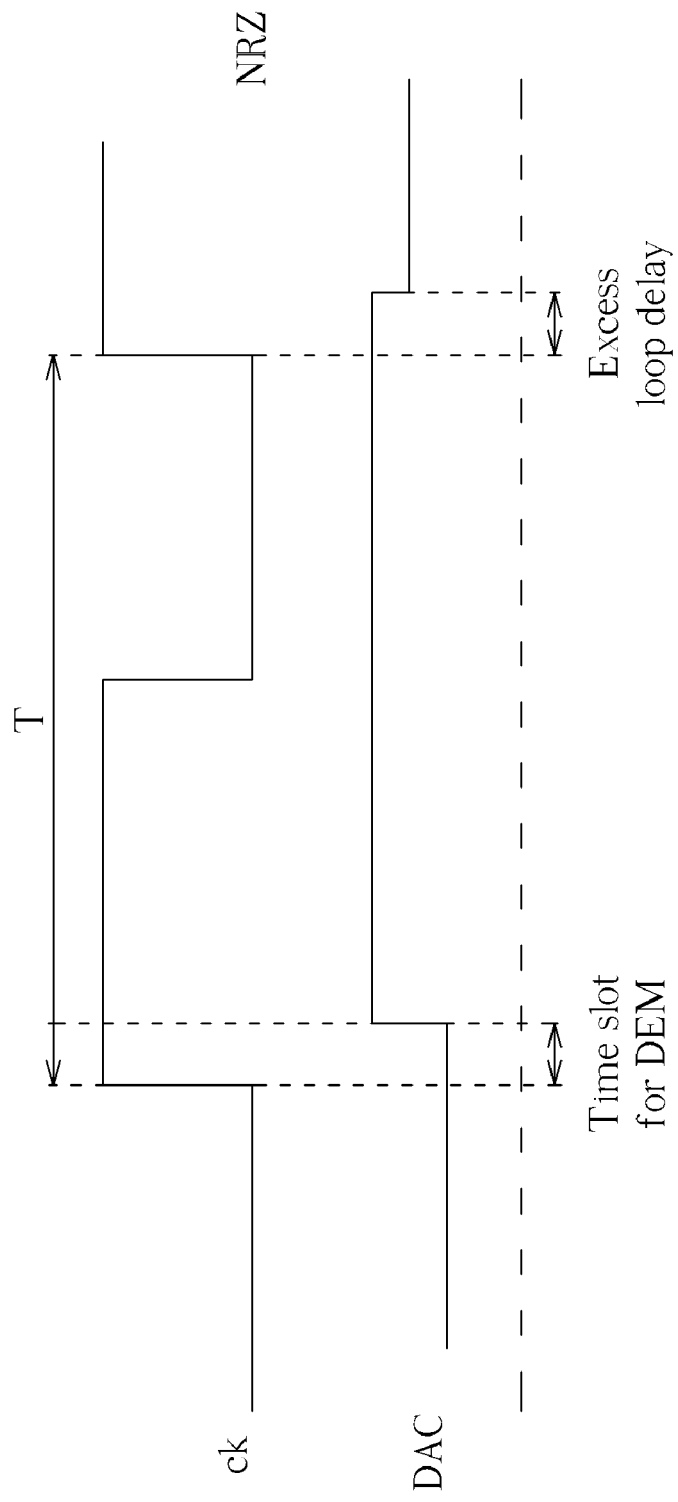
FIG. 3 is a waveform diagram of the DAC converter shown in FIG. 1 while the DAC converter is implemented with a non-return-to-zero (NRZ) DAC converter.
Figure 4:
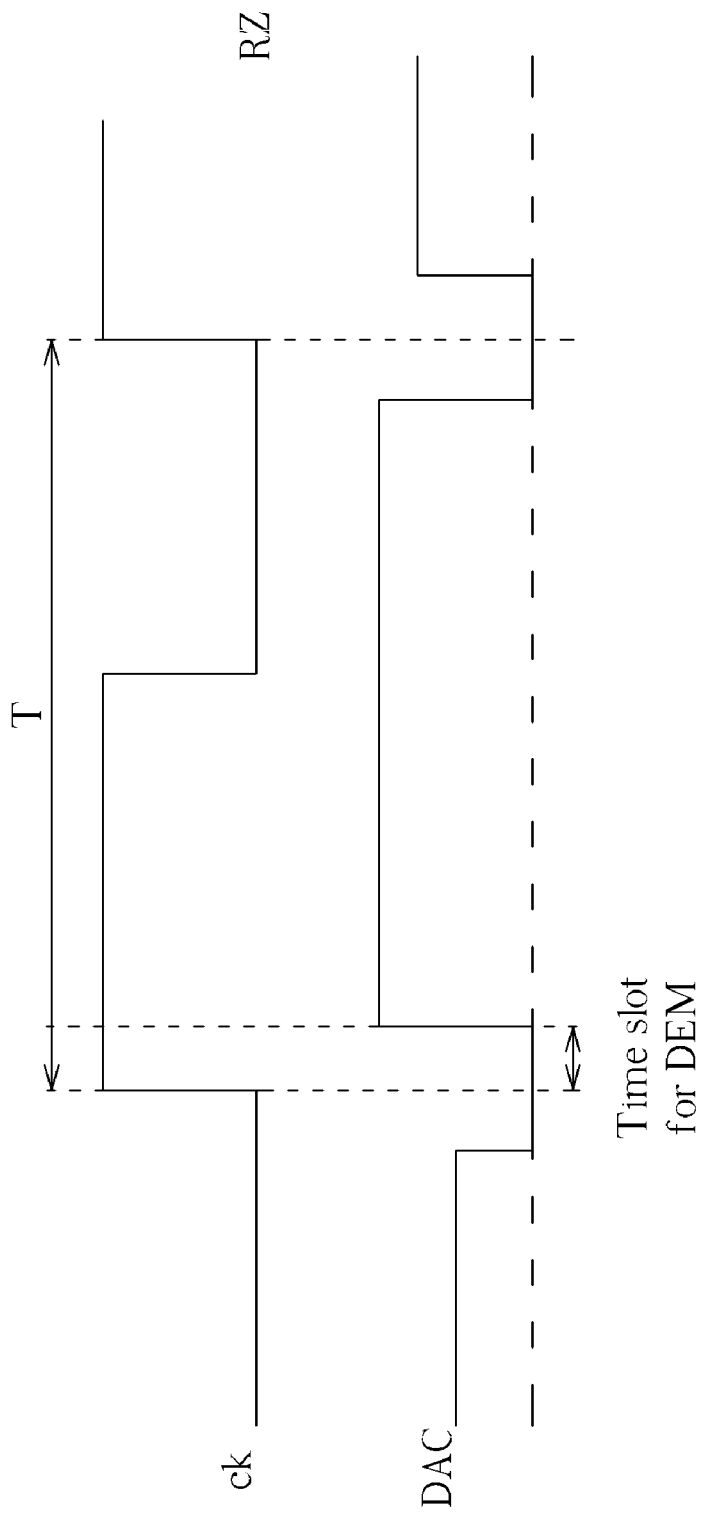
FIG. 4 is a waveform diagram of the DAC converter shown in FIG. 1 while the DAC converter is implemented with a return-to-zero (RZ) DAC converter.
Figure 7:
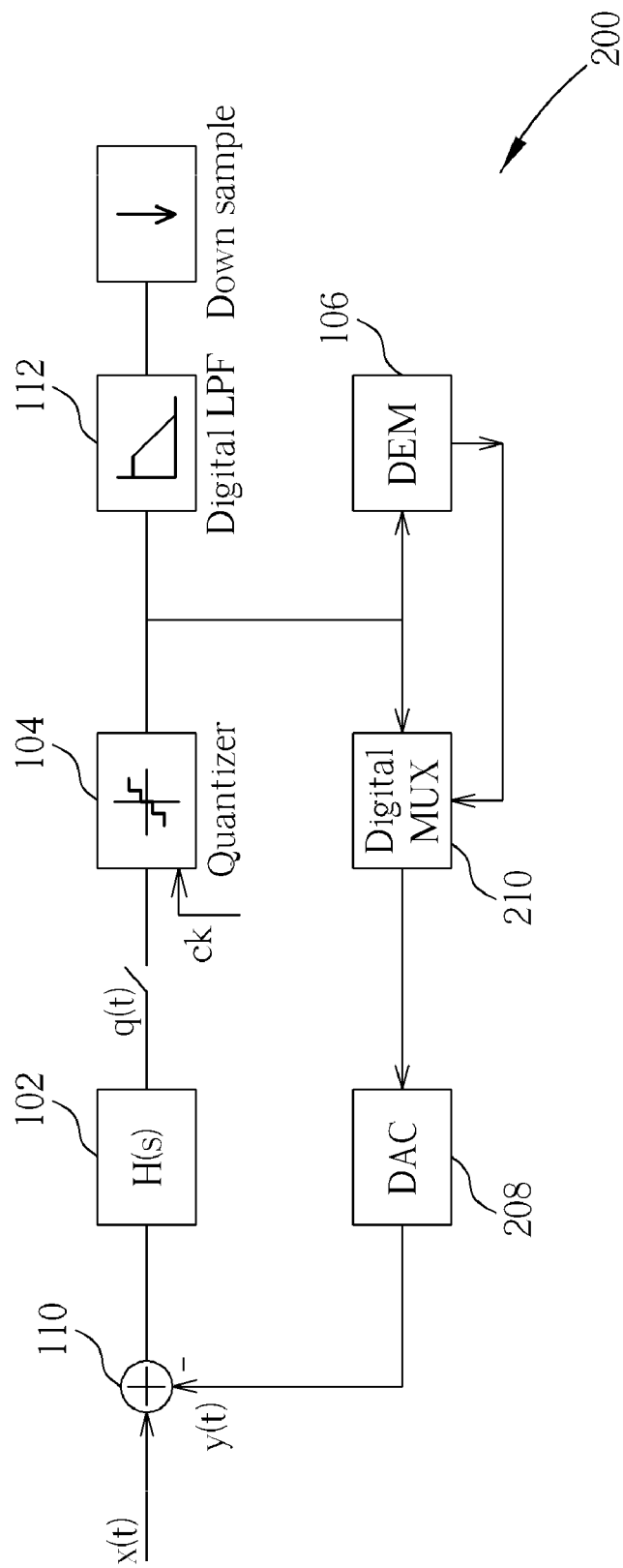
FIG. 7 is a diagram of a continuous-time sigma-delta modulator according to a first embodiment of the present invention.

Please refer to FIG. 7, which is a diagram of a continuous-time sigma-delta modulator 200 according to a first embodiment of the present invention. And please also refer to FIG. 8, which is a waveform diagram related to the continuous-time sigma-delta modulator 200 shown in FIG. 7. As shown in FIG. 7, compared to the continuous-time sigma-delta modulator 100 shown in FIG. 1, the DEM module 106 is moved out from the loop within the continuous-time sigma-delta modulator 100, and a digital multiplexer 210 is added instead for helping in cooperating with the DEM module 106 and in shuffling comparators of the quantizer 104, each of which corresponds to a particular DAC unit of the DAC converter 108 thus each the DAC unit is effectively shuffled. Note that operations of the DEM module 106 are independent from operations and signals on a loop including the frequency response module 102, the quantizer 104, the digital multiplexer 210, the DAC converter 208, and the adder 110. Moreover, the DAC converter 108 is also replaced with a return-to-zero (RZ) DAC converter 208 for avoiding the excess loop delay shown in FIG. 2. The continuous-time sigma-delta modulator 200 includes the frequency response module 102, the quantizer 104, the DEM module 106, the digital multiplexer 210, the RZ DAC converter 208, the adder 110, and the digital low-pass filter 112. Output bits from the quantizer 104 are inputted into the DAC converter 108 through the digital multiplexer 210 selected according to a DEM result of a previous cycle, and the output bits from the quantizer 104 are also inputted into the DEM module 106 for computing a selection result of the digital multiplexer 210 for a next cycle. Therefore, as can be observed from FIG. 8, besides a short time slot reserved for the quantizer 104, the rest of time in a same cycle of the clock signal ck may be completely reserved for the DEM module 106 since output bits being processed by the DEM module 106 at this time will be taken as input bits of the digital multiplexer 210 at a next cycle.

Figure 9:
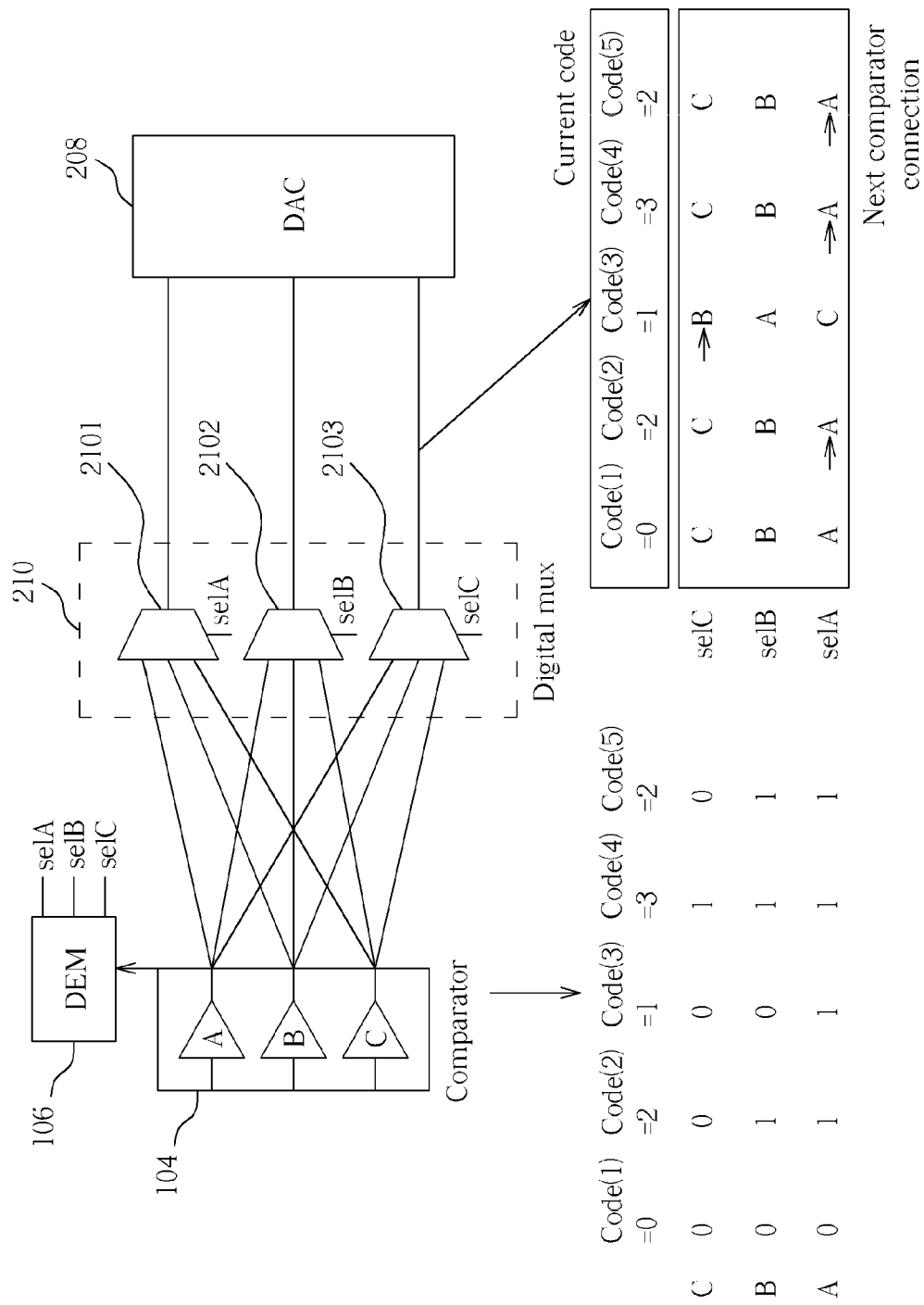
FIG. 9 illustrates a schematic diagram for explaining how the quantizer, the multiplexer, the DEM module, and the RZ DAC converter shown in FIG. 7 cooperate in performing dynamic element matching on comparators of the quantizer.

For further explaining properties or benefits of the continuous-time sigma-delta modulator 200, FIG. 9 illustrates a schematic diagram for explaining how the quantizer 104, the multiplexer 210, the DEM module 106, and the RZ DAC converter 208 cooperate in performing dynamic element matching on comparators of the quantizer 104. Note that for brevity of descriptions and diagrams, FIG. 9 merely illustrates the situation that values of processed codes range from 0 to 3, therefore, there are merely three comparators in the quantizer 104 and three sub-multiplexers 2101, 2102, and 2103 in the digital multiplexer 210. Output bits from the quantizer 104, i.e., from the comparators A, B, and C, are inputted to sub-multiplexers of the digital multiplexer 210 and the DEM module 106 respectively. The DEM module 106 is responsible for determining three selection signals selA, selB, and selC, all of which are then inputted to the sub-multiplexers 2101, 2102, and 2103 respectively. Therefore, each of the sub-multiplexers 2101, 2102, and 2103 receives all output bits from the comparators A, B, and C, and outputs one of the three output bits from the quantizer 104 according to a corresponding one among the selection signals selA, selB, and selC, to the DAC converter 208. Take both tables listed in FIG. 9 as an example, where the left table indicates raw data before being processed by both the digital multiplexer 210 and the DEM module 106, whereas the right table indicates data processed by both the digital multiplexer 210 and the DEM module 106. When the term Code(1)=0 appears, the selection set including selA, selB, selC is not updated. When the term Code(2)=2 appears, two bits 1 are outputted from the comparators A and B; at the same time (or cycle), the sub-multiplexer 2101 allows the output bit from the comparator A according to the selection signal selA, the sub-multiplexer 2102 allows the output bit from the comparator B according to the selection signal selB, and the sub-multiplexer 2103 allows the output bit from the comparator C according to the selection signal selC, according to a selection set of a previous cycle, i.e., the cycle when the term Code (1)=0 appears. For the next cycle when the term Code(3)=1 appears, the selection set including selA, selB, selC will be cyclically rotated downward by two positions or digits, and merely one bit 1 is outputted from the comparator A. At the cycle when the term Code(3)=1 appears, the sub-multiplexer 2101 allows the output bit from the comparator C according to the selection signal selA, the sub-multiplexer 2102 allows the output bit from the comparator A according to the selection signal selB, and the sub-multiplexer 2103 allows the output bit from the comparator B according to the selection signal selC For the cycle When the term Code(4)=3 appears, the selection set including of selA, selB, selC is cyclically rotated downward by one position or digits., and three bits 1 are outputted from the comparators A, B, and C; at the same cycle, the sub-multiplexer 2101 allows the output bit from the comparator A according to the selection signal selA, the sub-multiplexer 2102 allows the output bit from the comparator B according to the selection signal selB, and the sub-multiplexer 2103 allows the output bit from the comparator C according to the selection signal selC. For the cycle when the term Code(5)=2 appears, the selection set including selA, selB, selC will rotate downward by three positions or digits., two bits 1 is outputted from the comparators A and B; at the same cycle, the sub-multiplexer 2101 allows the output bit from the comparator A according to the selection signal selA, the sub-multiplexer 2102 allows the output bit from the comparator B according to the selection signal selB, and the sub-multiplexer 2103 allows the output bit from the comparator C according to the selection signal selC; for a next cycle, the selection set including selA, selB, selC will be cyclically rotated downward by two positions or digits.

Figure 6:
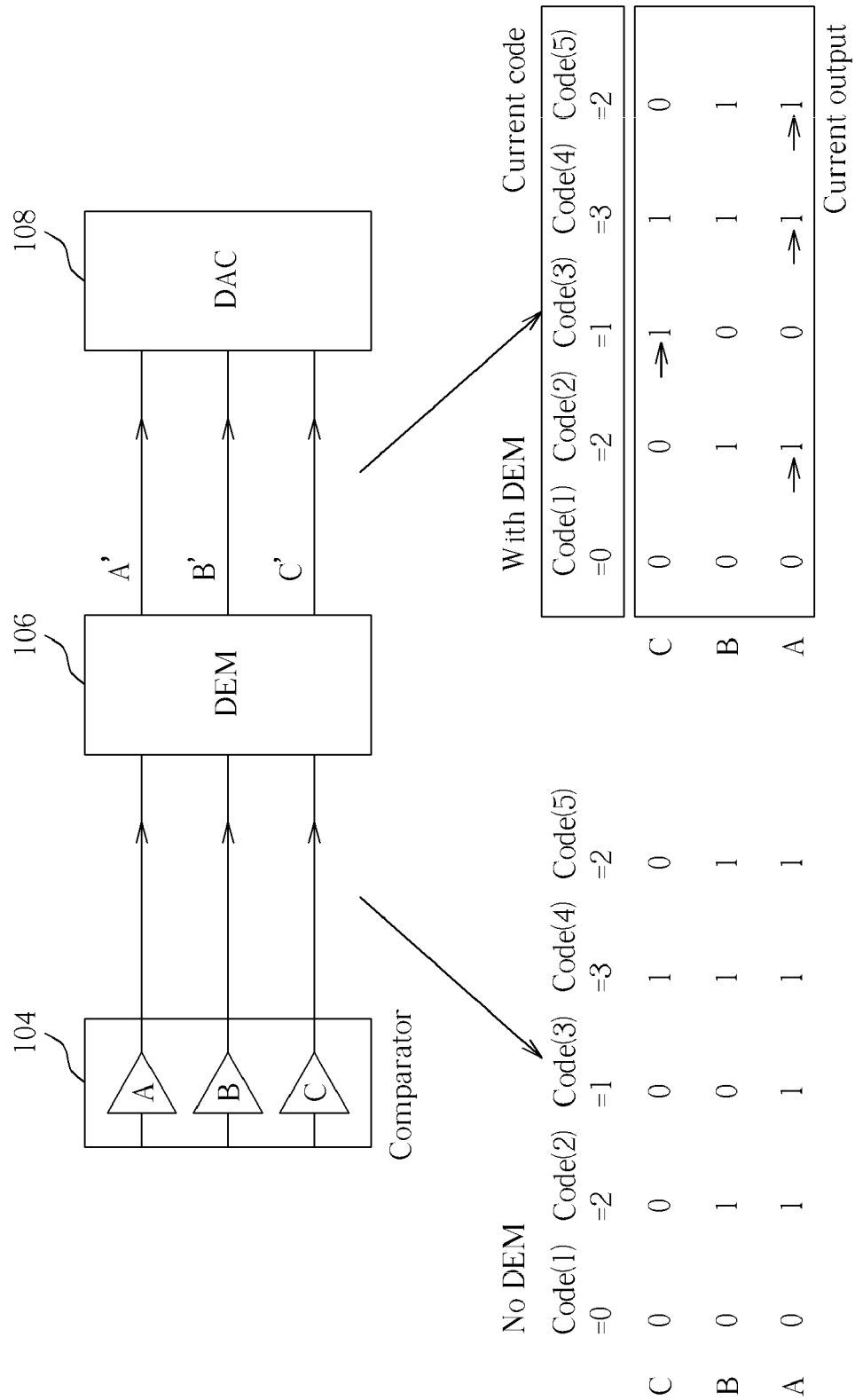
FIG. 6 is a schematic diagram for illustrating how DEM techniques shown in FIG. 5 work in the continuous-time sigma-delta modulator shown in FIG. 1.

By observing the right table in FIG. 9, it can be found that in the sub-multiplexers 2101, 2102, and 2103, each column in the right table shown in FIG. 9 indicates a cyclically shifted order of allowing the output bits from the comparators A, B, and C according to a code inputted in a previous cycle of the clock signal ck. For example, the term Code(3)=1 affects the cyclically shifted order in the column corresponding to the term Code(4)=3. Compared to what illustrated in FIG. 6, an order of allowing the output bits from the comparators A, B, and C is utilized instead of cyclically shifting output bits from the quantizer 104 so that the time slot for the DEM module 106 can be significantly shortened in each cycle of the clock signal ck.

Figure 8:
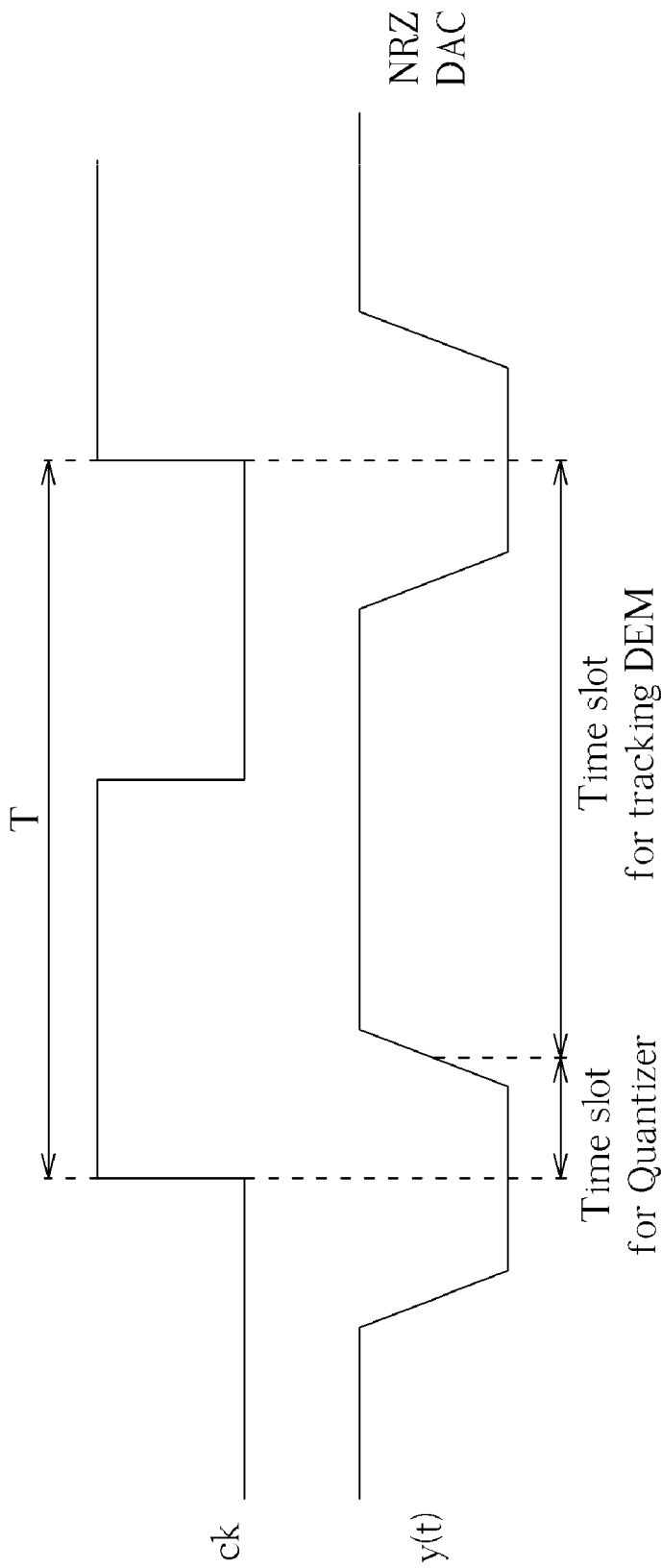
FIG. 8 is a waveform diagram related to the continuous-time sigma-delta modulator shown in FIG. 7.

In summary of what illustrated in FIG. 7, FIG. 8, and FIG. 9, the time slot for the DEM module 106 in each cycle of the clock signal ck may be reduced because (1) The DEM module 106 is moved out from the loop in the continuous-time sigma-delta modulator; and (2) The order of allowing the output bits from the comparators A, B, and C is utilized instead of cyclically shifting output bits from the quantizer 104 so that the time slot for the DEM module 106 can be significantly shortened in each cycle of the clock signal ck. Note that if latency of DEM results can be kept low enough, the abovementioned technique can still be applied to NRZ DAC.

Figure 10:
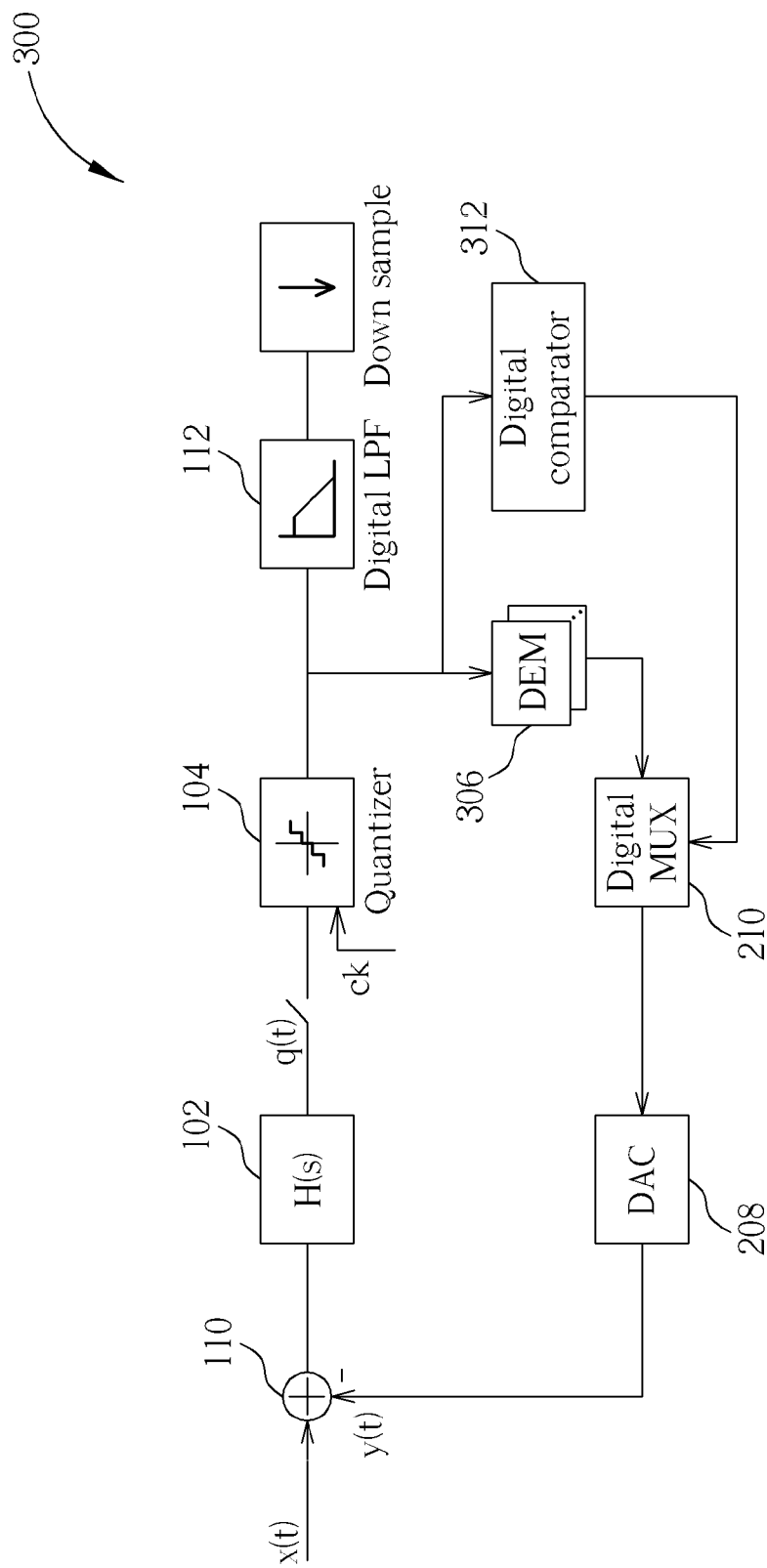
FIG. 10 is a diagram of a continuous-time sigma-delta modulator according to a second embodiment of the present invention.

Please refer to FIG. 10, which is a diagram of a continuous-time sigma-delta modulator 300 according to a second embodiment of the present invention. And please also refer to FIG. 11, which is a waveform diagram related to the continuous-time sigma-delta modulator 300 shown in FIG. 10. As shown in FIG. 10, and in comparison to the continuous-time delta-sigma modulators 100 and 200 shown in FIG. 1 and FIG. 7, a DEM group 306 including a plurality of DEM modules is used for replacing the DEM module 106, and moreover, a digital comparator 312 is further used for cooperating with both the digital multiplexer 210 and the DEM group 306. An input terminal of the DEM group 306 is coupled to the output terminal of the quantizer 104 for receiving a plurality of output bits from comparators within the quantizer 104. An output terminal of the DEM group 306 is coupled to a first input terminal of the digital multiplexer 210 for selecting a set of available output bits from a particular DEM module of the DEM group 306. The digital comparator 312 has an input terminal coupled to the output terminal of the quantizer 104 for receiving the plurality of output bits from comparators within the quantizer 104, and an output terminal coupled to a second input terminal of the digital multiplexer 210 for helping the digital multiplexer 210 in determining processed bits from which DEM module of the DEM group 306 are going to be allowed by the digital multiplexer 210. Similar with what can be observed from FIG. 8, in FIG. 11, besides a short time slot reserved for the quantizer 104, the rest of time in a same cycle of the clock signal ck may also be completely reserved for the DEM group 306 since candidate output bits have been generated in the DEM group 306 in advance so that an extremely short time slot is taken for selecting one particular set of DEM results from the DEM group 306. Note that operations of the digital comparator 312 and the DEM group 306 are independent from operations and signals on a loop including the frequency response module 102, the quantizer 104, the digital multiplexer 210, the DAC converter 208, and the adder 110.

Figure 12:
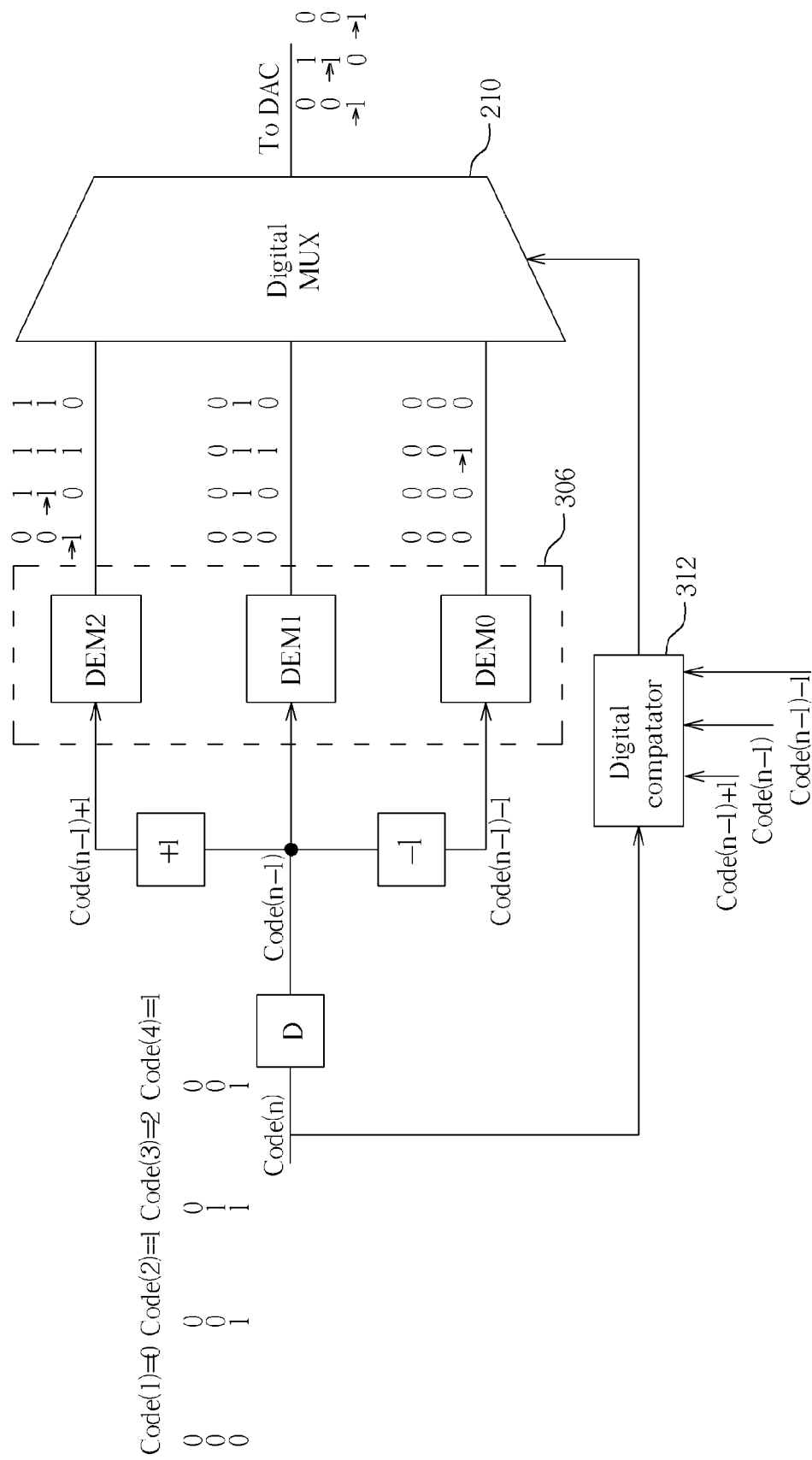
FIG. 12 illustrates a schematic block diagram for explaining how codes including output bits from the quantizer, the multiplexer, DEM modules of the DEM group, and the digital comparator shown in FIG. 10 cooperate in performing dynamic element matching.

For further explaining the continuous-time sigma-delta modulator 300, FIG. 12 illustrates a schematic block diagram for explaining how codes including output bits from the quantizer 104, the multiplexer 210, DEM modules of the DEM group 306, and the digital comparator 312 cooperate in performing dynamic element matching. Note that for brevity of descriptions and diagrams, FIG. 12 also merely illustrates the situation that values of processed codes range from 0 to 3, therefore, there are merely three DEM modules in the DEM group 306. Operations illustrated in FIG. 12 are briefly described as follows: (1) Delay a code Code(n) from the quantizer 104 by one cycle of the clock signal ck to generate a delayed code Code(n−1); (2) Calculate DEM results corresponding to codes Code(n−1)−1, Code(n−1), and Code(n−1)+1 respectively by the DEM modules DEM 0, DEM 1, and DEM 2 and stores the DEM results in a look-up table of the DEM group 306 in advance; (3) Compare the codes Code(n−1)−1, Code(n−1), and Code(n−1)+1 with the code Code(n) by the digital comparator 312 for inputting a matched code among said codes Code(n−1)−1, Code(n−1), and Code(n−1)+1 into the digital multiplexer 210; and (4) Select one DEM result from all the DEM modules DEM 0, DEM 1, and DEM 2 according to the matched code from the digital comparator 312. Note that since over-sampling is used in the continuous-time sigma-delta modulator 300, differences between adjacent codes, such as the codes Code(n−1) and Code(n), cannot be large, and therefore, since the values of the codes range from 0 to 3, a reasonable candidate difference between the adjacent codes Code(n−1) and Code(n) is ±1. DEM modules of the DEM group 306 calculates candidate DEM results in advance and looks the candidate DEM results up in the lookup table stored in the DEM group 306 when the code Code(n) comes out from the quantizer 104, and note that exemplary look-up DEM results are illustrated as sub-tables at right sides of the DEM modules DEM 0, DEM 1, and DEM 2 in FIG. 12. At the same time, the digital comparator 312 compares the codes Code(n−1)−1, Code(n−1), and Code(n−1)+1, which are used for predicting the value of the code Code(n), with the code Code(n) for outputting one of the codes Code(n−1)−1, Code(n−1), and Code(n−1)+1 into the digital multiplexer 210. At last, the digital multiplexer 210 selects one of the codes Code(n−1)−1, Code(n−1), and Code(n−1)+1 from a result of the digital comparator 312. As can be observed from the sub-tables at the right sides of the DEM modules DEM 0, DEM 1, and DEM 2, when the term Code(1)=0 appears, a predicted column code from the DEM module DEM 2 is selected; when the term Code(2)=1 appears, a predicted column code from the DEM module DEM 2 is selected; and when the term Code(3)=2 appears, a predicted column code from the DEM module DEM 0 is selected. Note that the predicted column codes are selected according to dynamic element matching, as mentioned before, so that related techniques are not repeatedly explained.

Figure 11:
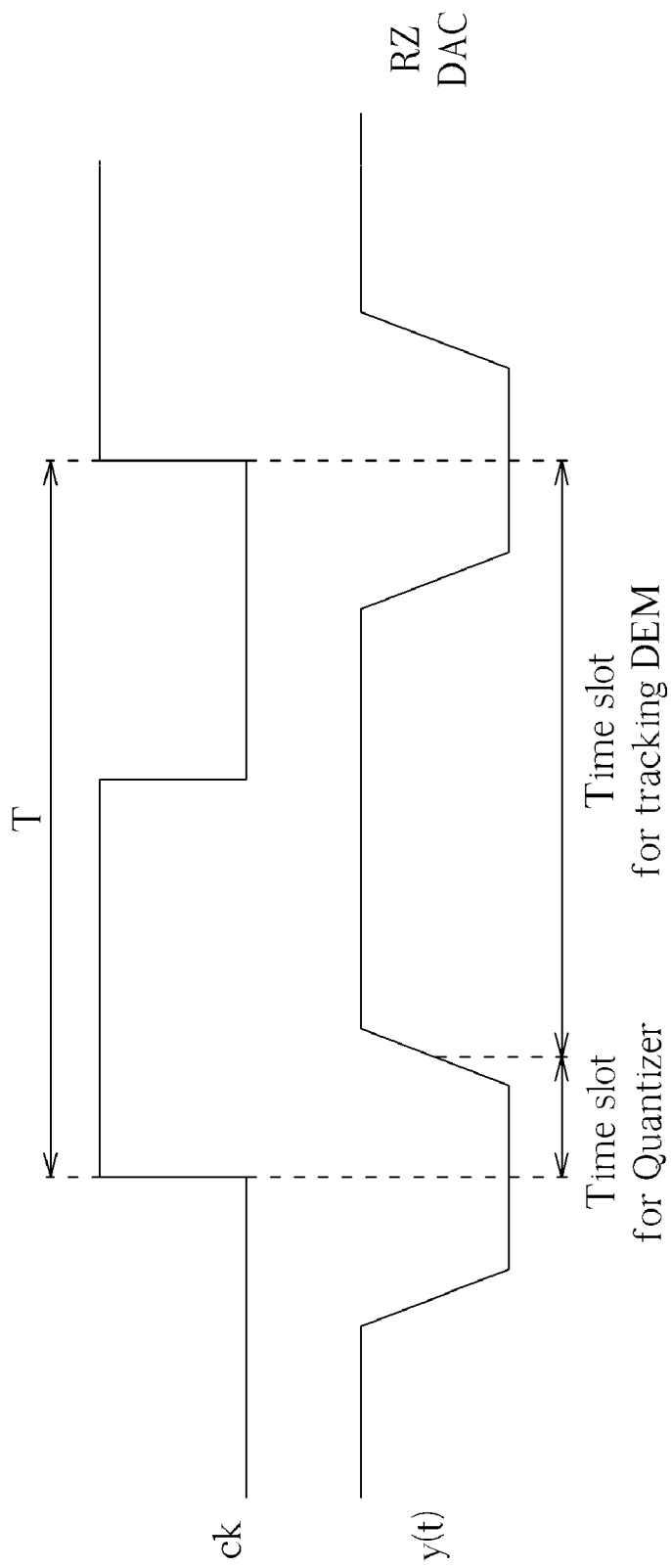
FIG. 11 is a waveform diagram related to the continuous-time sigma-delta modulator shown in FIG. 10.

According to what illustrated in FIG. 10, FIG. 11, and FIG. 12, the time slot for the DEM group 306 in each cycle of the clock signal ck may be significantly reduced because and (1) The DEM results are pre-calculated and stored in the lookup table of the DEM group so that final results related to codes outputted from the quantizer 104 may be looked up at any time; (2) The comparison in the digital comparator 312 takes a short time slot so that the result of the comparison acts as a quick key to the digital multiplexer 210 in retrieving related and looked-up DEM results from a corresponding DEM module. Therefore, according to descriptions related to FIG. 12, the continuous-time sigma-delta modulator 300 may reduce much DEM latency in each cycle of the clock signal ck.

Note that operations of both the continuous-time sigma-delta modulators 200 and 300 are all-digital so as to save power, occupy small area, and acquire instant calculations in related embodiments of the present invention.

Figure 13:
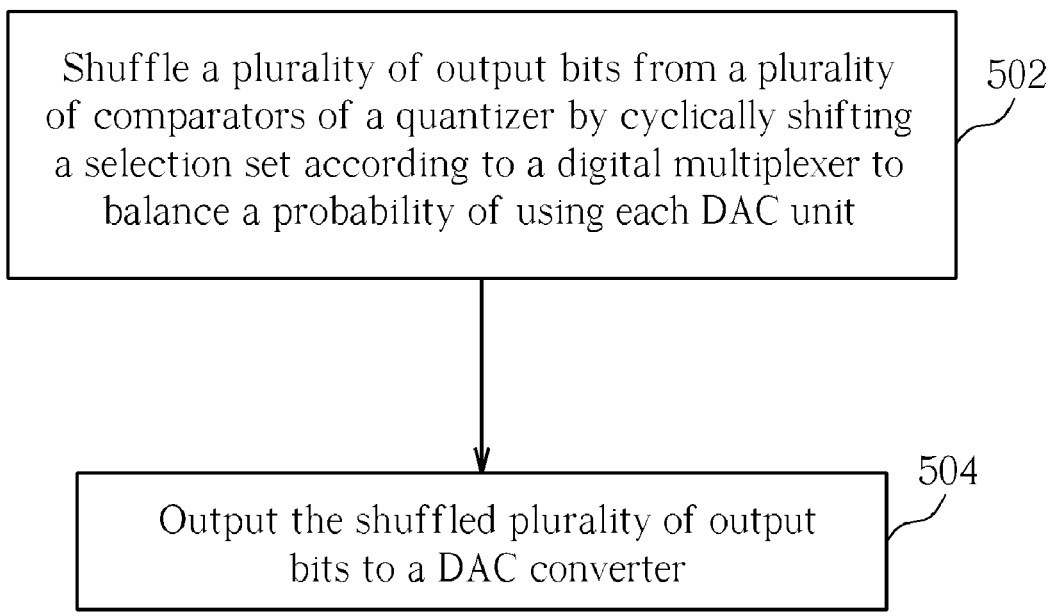
FIG. 13 is a flowchart of a DEM method applied on the continuous-time sigma-delta modulator shown in FIG. 7 and related to the schematic diagram shown in FIG. 9 according to a first embodiment of the present invention as a summary.

Please refer to FIG. 13, which is a flowchart of a DEM method applied on the continuous-time sigma-delta modulator 200 shown in FIG. 7 and related to the schematic diagram shown in FIG. 9 according to a first embodiment of the present invention as a summary. According to FIG. 13, the DEM method includes steps as follows:

Step 502: Shuffle a plurality of output bits from a plurality of comparators of a quantizer by cyclically shifting a selection set according to a digital multiplexer to balance a probability of using each DAC unit Step 504: Output the shuffled plurality of output bits to a DAC converter.

Figure 14:
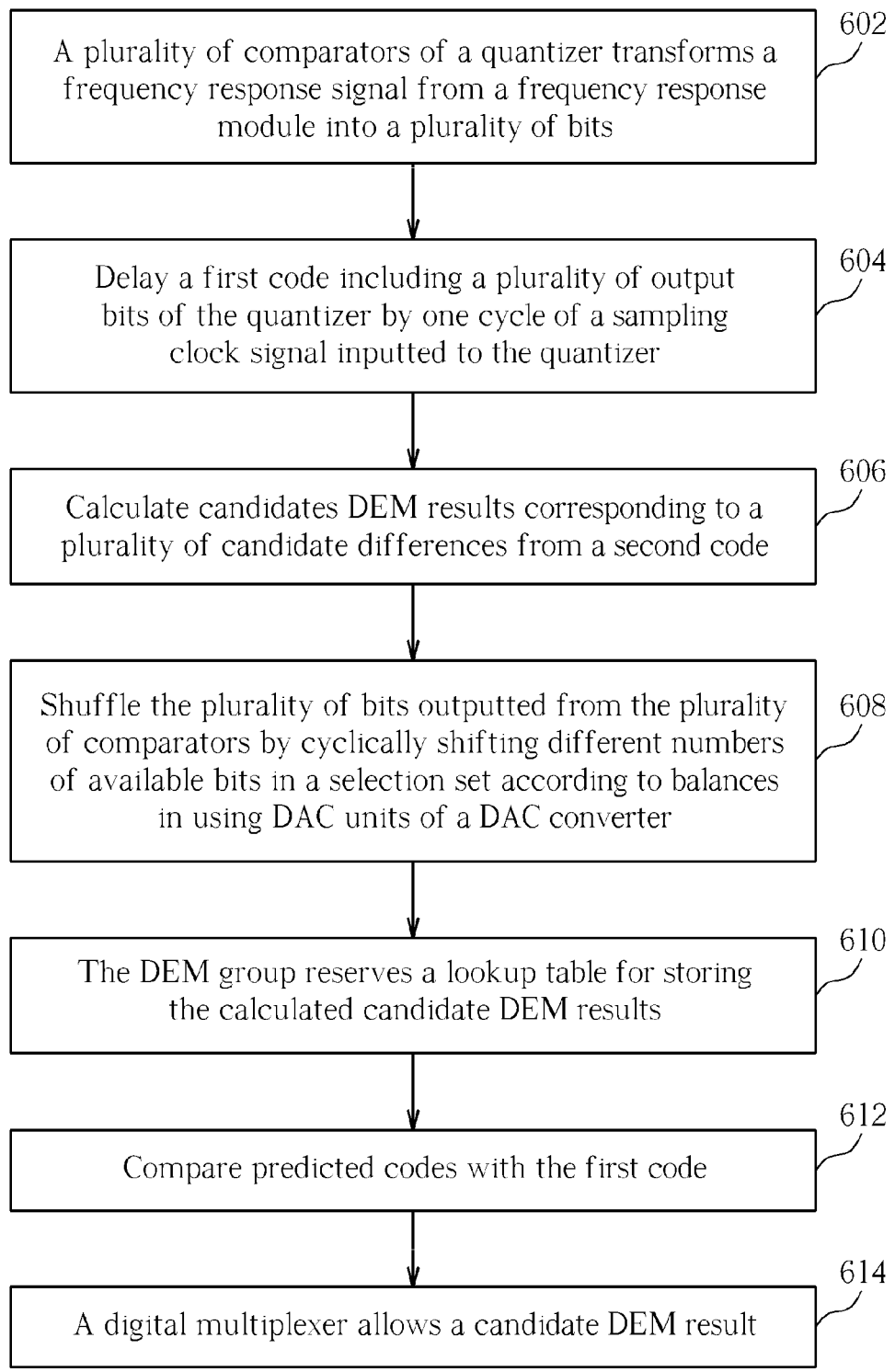
FIG. 14 is a flowchart of a DEM method applied on the continuous-time sigma-delta modulator shown in FIG. 10 and related to the schematic diagram shown in FIG. 12 according to a second embodiment of the present invention as a summary.

Please refer to FIG. 14, which is a flowchart of a DEM method applied on the continuous-time sigma-delta modulator 300 shown in FIG. 10 and related to the schematic diagram shown in FIG. 12 according to a second embodiment of the present invention as a summary. According to FIG. 14, the DEM method includes steps as follows:

Step 602: A plurality of comparators of a quantizer transforms a frequency response signal from a frequency response module into a plurality of bits, each of which is outputted from a corresponding comparator of the plurality of comparators;

Step 604: Delay a first code including a plurality of output bits of the quantizer by one cycle of a sampling clock signal inputted to the quantizer;

Step 606: Calculate candidates DEM results corresponding to a plurality of candidate differences from a second code, which is generated by delaying the first code by one cycle of the sampling clock signal, for each of a plurality of DEM modules of a DEM group;

Step 608: Shuffle the plurality of bits outputted from the plurality of comparators by cyclically shifting different numbers of available bits in a selection set according to balances in using DAC units of a DAC converter;

Step 610: The DEM group reserves a lookup table for storing the calculated candidate DEM results;

Step 612: Compare predicted codes, which are generated by adding the plurality of candidate differences to the second code, with the first code; and Step 614: A digital multiplexer allows a candidate DEM result, which is looked up from the lookup table, according to a predicted code, which matches the first code and is outputted by using results of the digital comparator, at each cycle of a sampling clock signal.

Note that the orders of executing steps in flowcharts shown in FIG. 13 and FIG. 14 may be substituted or permuted in embodiments of the present invention so that the executing orders of the steps in the flowcharts shown in FIG. 13 and FIG. 14 should not be limitations to the present invention.

The present invention discloses continuous-time sigma-delta modulators and DEM methods applied on the disclosed continuous-time sigma-delta modulators. With the aid of the continuous-time sigma-delta modulators and the DEM methods, in each cycle of a sampling signal, a time slot for related DEM operations might be significantly increased without being rushed.

Those skilled in the art will readily observe that numerous modifications and alterations of the device and method may be made while retaining the teachings of the invention.

What is claimed is:

1. A continuous-time sigma-delta modulator using dynamic element matching (DEM), comprising:
    a frequency response module;
    a quantizer having an input terminal coupled to an output terminal of the frequency response module;
    a digital multiplexer having a first input terminal coupled to an output terminal of the quantizer;
    a DEM module having an input terminal coupled to the output terminal of the quantizer, and having an output terminal coupled to a second input terminal of the digital multiplexer;
    a digital-to-analog (DAC) converter having an input terminal coupled to an output terminal of the digital multiplexer; and
    an adder having a first input terminal for receiving a continuous-time signal, having a second input terminal coupled to an output terminal of the DAC converter, and having an output terminal coupled to an input terminal of the frequency response module;
    wherein output signals of the quantizer during a current cycle are sent to the DEM module to determine a selection result of the digital multiplexer at a next cycle.

2. The continuous-time sigma-delta modulator of claim 1 further comprising:
    a digital low-pass filter (LPF) having an input terminal coupled to the output terminal of the quantizer.

3. The continuous-time sigma-delta modulator of claim 1 wherein the DAC converter is a return-to-zero (RZ) DAC converter.

4. The continuous-time sigma-delta modulator of claim 1 wherein the quantizer comprises a plurality of comparators, each of which has an input terminal coupled to the input terminal of the quantizer and has an output terminal coupled to the output terminal of the quantizer;
    wherein the plurality of comparators are used for transforming a frequency response signal from the frequency response module into a plurality of bits, each of which is outputted from a corresponding comparator of the plurality of comparators.

5. The continuous-time sigma-delta modulator of claim 4 wherein the digital multiplexer and the DEM module cooperate for shuffling the plurality of output bits from the plurality of comparators by cyclically shifting available bits in a selection set according to balances in using DAC units of the DAC converter;
    wherein operations of the DEM module are independent from operations and signals on a loop including the frequency response module, the quantizer, the digital multiplexer, the DAC converter, and the adder;
    wherein the shuffled plurality of output bits are inputted from the digital multiplexer into the DAC converter.

6. The continuous-time sigma-delta modulator of claim 1 wherein the quantizer comprises a plurality of comparators, each of which outputs a bit;
    wherein the digital multiplexer comprises a plurality of sub-multiplexes, each of which has input terminals coupled to an output terminal of each of the plurality of comparators in the quantizer for receiving the output bits from the plurality of comparators;
    wherein the DEM module has output terminals coupled to each of the sub-multiplexers for determining which one among the output bits of the plurality of comparators is allowed in each of the sub-multiplexers.

7. A continuous-time sigma-delta modulator using dynamic element matching (DEM), comprising:
    a frequency response module;
    a quantizer having an input terminal coupled to an output terminal of the frequency response module;
    a DEM group having a plurality of DEM modules, and having an input terminal coupled to the output terminal of the quantizer;
    a digital multiplexer having a first input terminal coupled to an output terminal of the DEM group;
    a digital comparator having an input terminal coupled to the quantizer, and having an output terminal coupled to the digital multiplexer;
    a digital-to-analog (DAC) converter having an input terminal coupled to an output terminal of the digital multiplexer; and
    an adder having a first input terminal for receiving a continuous-time signal, having a second input terminal coupled to an output terminal of the DAC converter, and having an output terminal coupled to an input terminal of the frequency response module;
    wherein each of the plurality of DEM modules in the DEM group generates a candidate selection result of the digital multiplexer in advance;
    wherein output signals of the quantizer during a current cycle are sent to both the DEM group and the digital comparator to compare incoming codes from the quantizer with predicted codes from the DEM group for determining a selected result from a plurality of candidate selection results from the DEM group by the digital multiplexer at a next cycle.

8. The continuous-time sigma-delta modulator of claim 7 further comprising:
    a digital low-pass filter (LPF) having an input terminal coupled to the output terminal of the quantizer.

9. The continuous-time sigma-delta modulator of claim 7 wherein the DAC converter is a return-to-zero (RZ) DAC converter.

10. The continuous-time sigma-delta modulator of claim 7
wherein the quantizer comprises a plurality of comparators connected in parallel, each of which has an input terminal coupled to the input terminal of the quantizer and has an output terminal coupled to the output terminal of the quantizer;
wherein operations of the digital comparator and the DEM group are independent from operations and signals on a loop including the frequency response module, the quantizer, the digital multiplexer, the DAC converter, and the adder;
wherein one candidate selection result is loaded from one selected DEM module of the DEM group according to operations of the digital comparator each time before the digital multiplexer outputs the selected result;
wherein the plurality of comparators are used for transforming a frequency response signal from the frequency response module into a plurality of bits, each of which is outputted from a corresponding comparator of the plurality of comparators.

11. The continuous-time sigma-delta modulator of claim 10
wherein the digital multiplexer and the plurality of DEM modules in the DEM group cooperate for shuffling the plurality of bits outputted from the plurality of comparators by cyclically shifting different numbers of available bits in a selection set according to balances in using DAC units of the DAC converter;
wherein the digital comparator is used for determining a shuffled plurality of bits by cyclically shifting a specific number of the available bits in the selection set.

12. The continuous-time sigma-delta modulator of claim 6
wherein a first code including a plurality of output bits of the quantizer is delayed by one cycle of a sampling clock signal inputted to the quantizer;
wherein each of the plurality of DEM modules of the DEM group calculates candidates DEM results corresponding to a plurality of candidate differences from a second code, which is generated by delaying the first code by one cycle of the sampling clock signal;
wherein the DEM group reserves a lookup table for storing the calculated candidate DEM results;
wherein the digital comparator compares predicted codes, which are generated by adding the plurality of candidate differences to the second code, with the first code;
wherein the digital multiplexer allows a candidate DEM result, which is looked up from the lookup table, according to a predicted code, which matches the first code and is outputted from the digital comparator, at each cycle of the sampling clock signal.

13. A dynamic element matching method for a continuous-time sigma-delta modulator comprises:
a plurality of sub-multiplexers of a digital multiplexer receiving output bits from a plurality of comparators of a quantizer;
a DEM module determining which one among the output bits of the plurality of comparators is allowed in each of the sub-multiplexers as a result to be outputted to a digital-to-analog (DAC) converter; and
outputting the result to the DAC converter.

14. The method of claim 13
wherein the continuous-time sigma-delta modulator comprises a frequency response module;
the quantizer having an input terminal coupled to an output terminal of the frequency response module;
the digital multiplexer having a first input terminal coupled to an output terminal of the quantizer;
the DEM module having an input terminal coupled to the output terminal of the quantizer, and having an output terminal coupled to a second input terminal of the digital multiplexer;
the digital-to-analog (DAC) converter having an input terminal coupled to an output terminal of the digital multiplexer;
an adder having a first input terminal for receiving a continuous-time signal, having a second input terminal coupled to an output terminal of the DAC converter, and having an output terminal coupled to an input terminal of the frequency response module;
a digital low-pass filter (LPF) having an input terminal coupled to the output terminal of the quantizer;
wherein output signals of the quantizer during a current cycle are sent to the DEM module to determine a selection result of the digital multiplexer at a next cycle.

15. The method of claim 14 wherein the DAC converter is a return-to-zero (RZ) DAC converter.

16. A dynamic element matching method for a continuous-time sigma-delta modulator comprises:
a plurality of comparators of a quantizer transforming a frequency response signal from a frequency response module into a plurality of bits, each of which is outputted from a corresponding comparator of the plurality of comparators;
shuffling the plurality of bits outputted from the plurality of comparators by cyclically shifting different numbers of available bits in a selection set according to balances in using DAC units of a DAC converter; and
a digital comparator determining a shuffled plurality of bits by comparing predicted codes with incoming codes.

17. The method of claim 16 further comprising:
delaying a first code including a plurality of output bits of the quantizer by one cycle of a sampling clock signal inputted to the quantizer;
calculating candidates DEM results corresponding to a plurality of candidate differences from a second code, which is generated by delaying the first code by one cycle of the sampling clock signal, for each of a plurality of DEM modules of a DEM group;
the DEM group reserving a lookup table for storing the calculated candidate DEM results;
comparing predicted codes, which are generated by adding the plurality of candidate differences to the second code, with the first code; and
a digital multiplexer allowing a candidate DEM result, which is looked up from the lookup table, according to a predicted code, which matches the first code and is outputted from the digital comparator, at each cycle of a sampling clock signal.

18. The method of claim 17
wherein the continuous-time sigma-delta modulator using dynamic element matching (DEM) comprises:
the frequency response module;
the quantizer having an input terminal coupled to an output terminal of the frequency response module, for outputting the incoming codes;
the DEM group having the plurality of DEM modules, and having an input terminal coupled to the output terminal of the quantizer, for generating and storing the predicted codes in advance;

the digital multiplexer having a first input terminal coupled to an output terminal of the DEM group;

the digital comparator having an input terminal coupled to the quantizer, and having an output terminal coupled to the digital multiplexer;

the digital-to-analog (DAC) converter having an input terminal coupled to an output terminal of the digital multiplexer;

an adder having a first input terminal for receiving a continuous-time signal, having a second input terminal coupled to an output terminal of the DAC converter, and having an output terminal coupled to an input terminal of the frequency response module; and a digital low-pass filter (LPF) having an input terminal coupled to the output terminal of the quantizer.

19. The method of claim 18 wherein the DAC converter is a return-to-zero (RZ) DAC converter.

* * * * *